(12) United States Patent
Chang (10) Patent No.: US 6,861,180 B2
(45) Date of Patent: Mar. 1, 2005

(54) CONTACT PRINTING AS SECOND EXPOSURE OF DOUBLE EXPOSURE ATTENUATED PHASE SHIFT MASK PROCESS

(75) Inventor: Chung-Hsing Chang, Taipei (TW)

(73) Assignee: Taiwan Semiconductor Manufacturing Co., Ltd, Hsin Chu (TW)

( * ) Notice: Subject to any disclaimer, the term of this patent is extended or adjusted under 35 U.S.C. 154(b) by 151 days.

(21) Appl. No.: 10/241,675

(22) Filed: Sep. 10, 2002

(65) Prior Publication Data

US 2004/0048166 A1 Mar. 11, 2004

(51) Int. Cl.[7] .............................. G03F 9/00; G03C 5/00
(52) U.S. Cl. .......................................... 430/5; 430/394
(58) Field of Search ............................... 430/5, 394, 22

(56) References Cited

U.S. PATENT DOCUMENTS 5,633,102 A * 5/1997 Toh et al. ...................... 430/5
5,783,337 A * 7/1998 Tzu et al. ...................... 430/5

* cited by examiner

*Primary Examiner*—Salema R. Mohamedulla
(74) *Attorney, Agent, or Firm*—Tung & Associates (57) ABSTRACT

Utilizing contact printing as the second exposure within a double exposure attenuated phase shift mask (APSM) fabrication process is disclosed. The process defines the shift pattern within the attenuated layer of the APSM using a first exposure, such as electron beam (e-beam) writing. The attenuated layer may be MoSi, MoSiO, and so on. The process then defines the border pattern within the opaque layer of the APSM using a second exposure. The second exposure employs contact printing, utilizing a contact exposure mask. The contact printing process may align the contact exposure mask over the wafer on which the APSM is fabricated utilizing a camera and an image storage system storing an image of this wafer.

20 Claims, 13 Drawing Sheets

CONTACT PRINTING AS SECOND EXPOSURE OF DOUBLE EXPOSURE ATTENUATED PHASE SHIFT MASK PROCESS

FIELD OF THE INVENTION

This invention relates generally to semiconductor fabrication, and more particularly to a double exposure attenuated phase shift mask (APSM) process that may be used within such fabrication.

BACKGROUND OF THE INVENTION

Since the invention of the integrated circuit (IC), semiconductor chip features have become exponentially smaller and the number of transistors per device exponentially larger. Advanced IC's with hundreds of millions of transistors at feature sizes of 0.25 micron, 0.18 micron, 0.10 micron, and less are becoming routine. Improvement in overlay tolerances in optical photolithography, and the introduction of new light sources with progressively shorter wavelengths, have allowed optical steppers to significantly reduce the resolution limit for semiconductor fabrication far beyond one micron. To continue to make chip features smaller, and increase the transistor density of semiconductor devices, IC's have begun to be manufactured that have features smaller than the lithographic wavelength.

Sub-wavelength lithography, however, places large burdens on optical lithographic processes. Resolution of anything smaller than a wavelength is generally quite difficult. Pattern fidelity can deteriorate dramatically in sub-wavelength lithography. Critical dimensions (CD's), which are the geometries and spacings used to monitor the pattern size and ensure that it is within the customer's specification, are especially important to have size maintenance during processing. Semiconductor features may deviate significantly in size and shape from the ideal pattern drawn by the circuit designer.

Among various resolution-enhancement technologies (RET's) that have been developed in recent decades, attenuated phase shift masks (APSM) have provided improved image contrast and lithographic resolution over standard binary masks. An attenuated PSM forms shift patterns through adjacent areas of quartz and a low-transmission material such as molybdenum silicide (MoSi). Unlike chrome, MoSi allows a small percentage of the light to pass through, such as 4%, 6%, 18%, and so on. The thickness of the MoSi is usually chosen so the light that does pass through is 180 degrees out of phase with the light that passes through the neighboring clear quartz areas. The APSM is usually fabricated with a double exposure process, because a border pattern as well as a shift pattern must be defined. This lengthens processing time, and thus increases semiconductor foundry costs. The border pattern is defined through an opaque material, such as chrome.

Figure 1A:
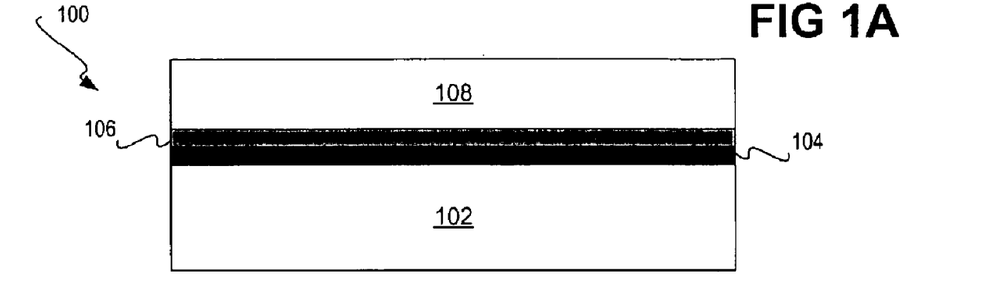
FIGS. 1A–1K are diagrams illustrating the conventional double exposure attenuated phase shift mask (APSM) fabrication process utilizing laser beam writing for the second exposure.
Figure 1B:
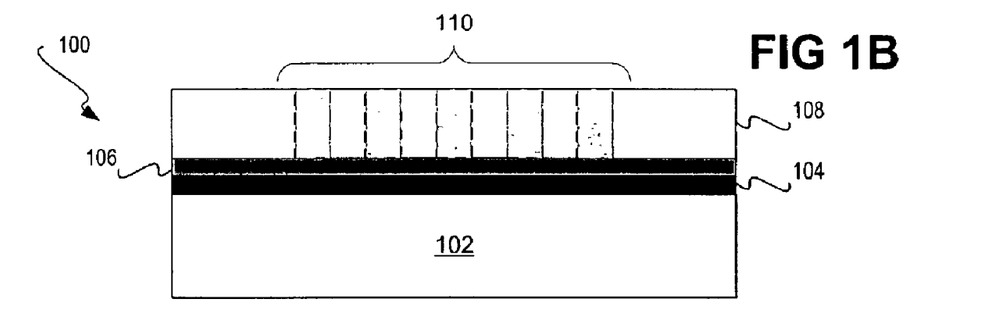
Figure 1C:
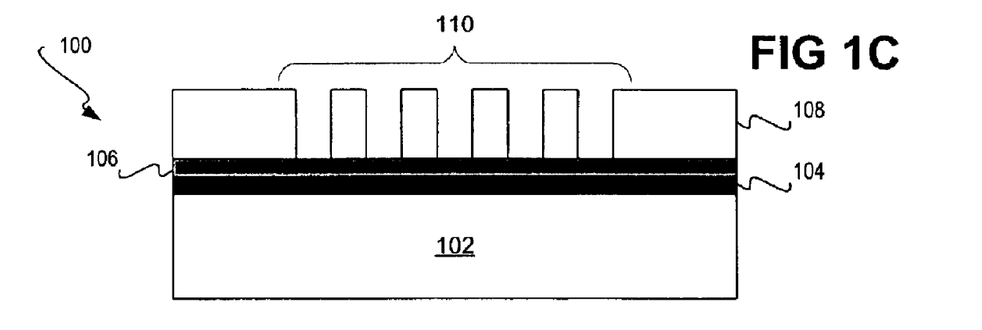
Figure 1D:
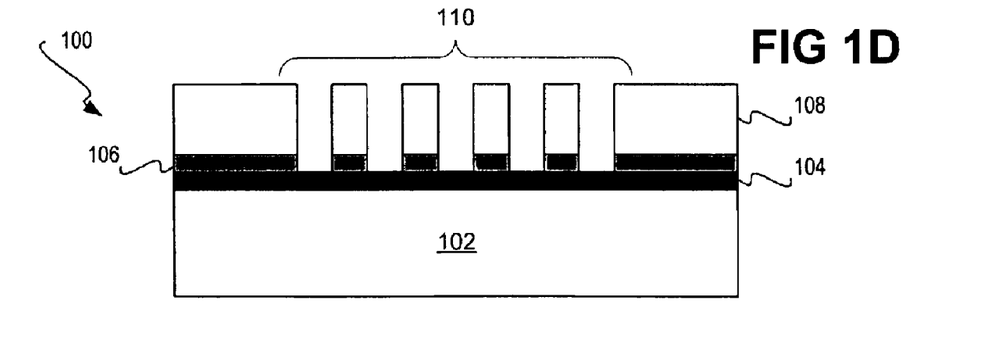
Figure 1E:
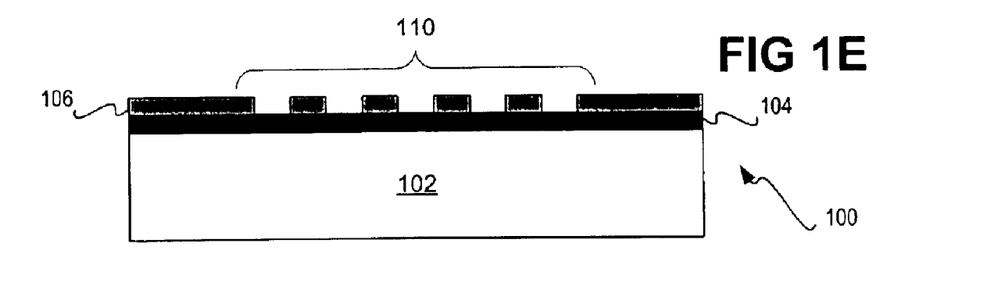
Figure 1F:
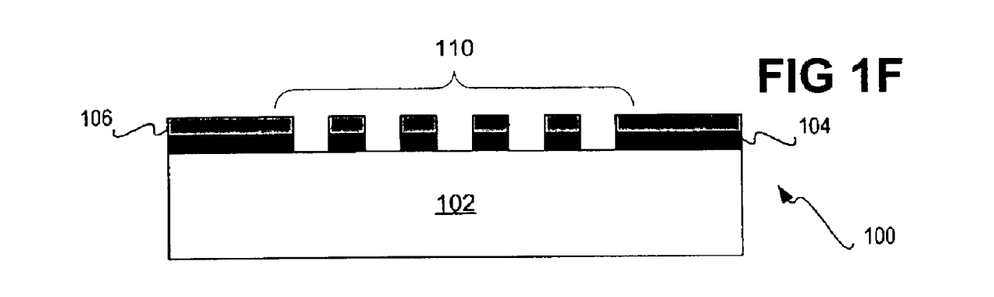

The conventional double exposure APSM fabrication process is shown in FIGS. 1A–1K. In FIG. 1A, the APSM 100 includes a transparent substrate 102, such as quartz. Over the transparent substrate 102 is an attenuated layer 104, such as MoSiO, and an opaque layer 106, such as chrome. Photoresist 108 is deposited over the opaque layer 106. In FIG. 1B, the first exposure takes place, by electron beam (e-beam) writing desired areas 110 within the photoresist 108. In FIG. 1C, the exposed areas 110 are developed, removing the photoresist 108 from the areas 110. In FIG. 1D, the opaque layer 106 is etched through the exposed areas 110, and in FIG. 1E, the photoresist 108 is removed, such as by photoresist stripping and subsequent cleaning of the APSM 100. Finally, in FIG. 1F, the attenuated layer 104 is etched through the exposed areas 110. Thus, the first exposure of the APSM fabrication process is for defining the shift pattern of the APSM 100 within the attenuated layer 104.

Figure 1G:
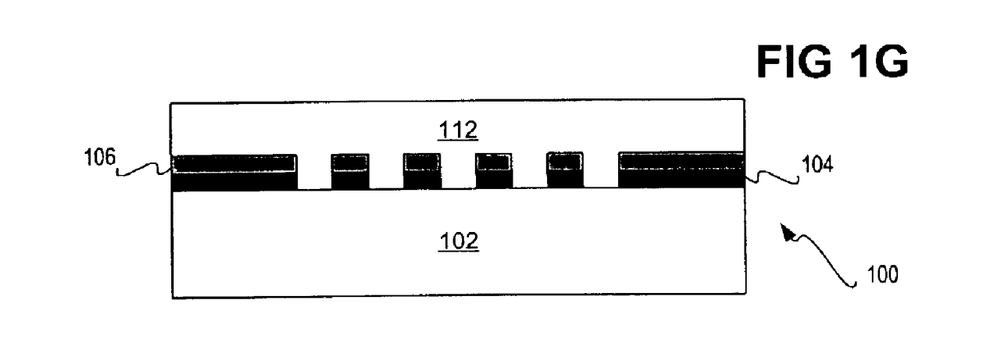
Figure 1H:
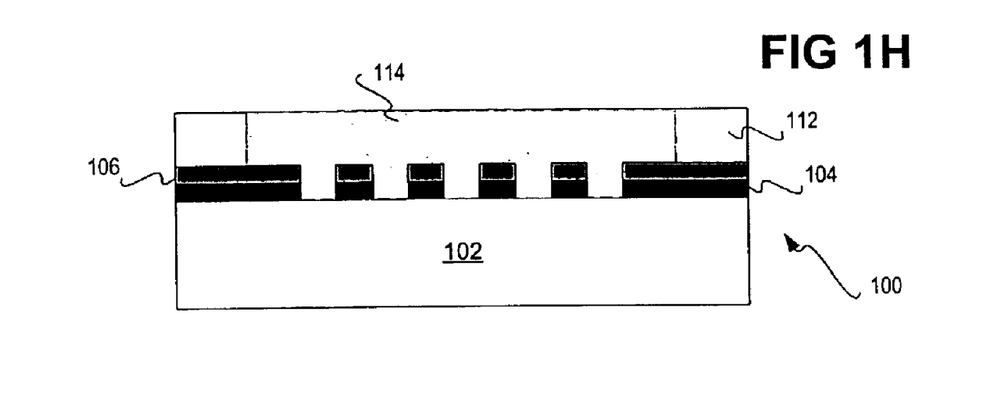
Figure 1I:
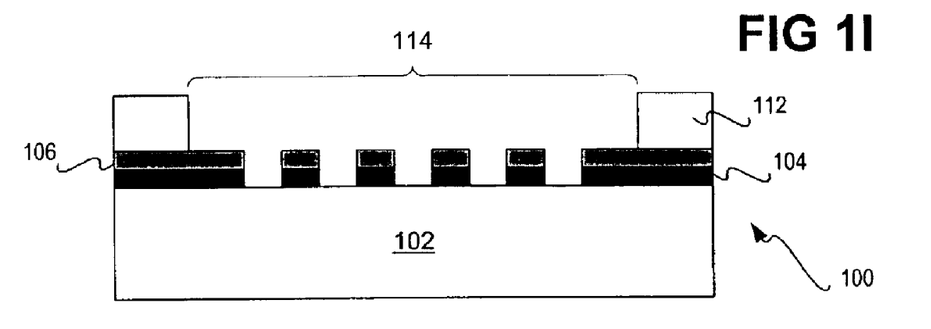
Figure 1J:
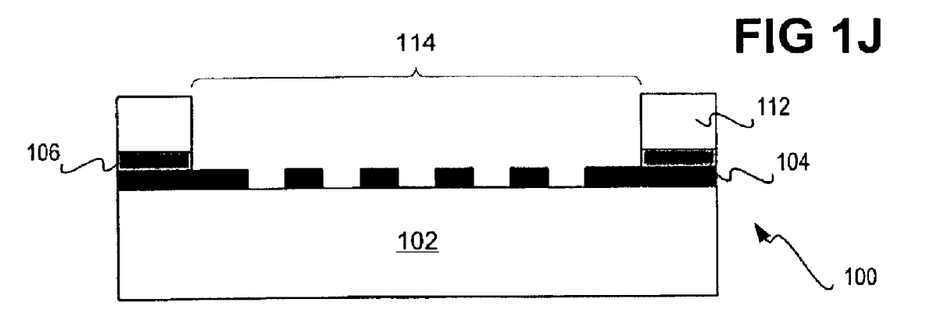
Figure 1K:
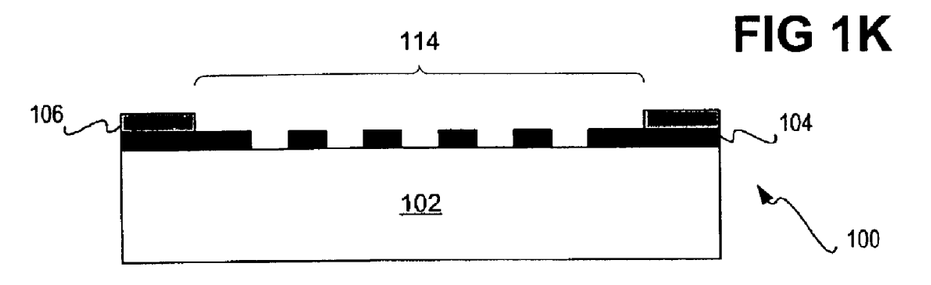

Next, in FIG. 1G, another layer of photoresist 112 is coated onto the APSM 100. In FIG. 1H, the second exposure takes place, via laser beam writing a desired area 114 within the photoresist 112. The second exposure process can take upwards of two-and-a-half hours, lengthening processing time of the APSM 100. The second exposure process is needed to define a border pattern for the APSM 100. In FIG. 1I, the exposed area 114 is developed, removing the photoresist 112 from the area 114. In FIG. 1J, the opaque layer 106 is etched through the exposed area 114. Finally, in FIG. 1K, the photoresist 112 is removed, such as by photoresist stripping and subsequent cleaning of the APSM 100. Thus, the second exposure of the double exposure APSM fabrication process is for defining the border pattern of the APSM 100 within the opaque layer 106, where the opaque layer 106 may be chrome.

As has been indicated, the second exposure of the APSM fabrication process can take upwards of two-and-a-half hours to be completed when using laser beam writing. This is disadvantageous, because it lengthens processing times for fabrication of APSM's, and thus increases semiconductor foundry cost and reduces throughput and efficiency. Therefore, there is a need for an improved double exposure APSM fabrication process. Such an improved process should not utilize laser beam writing for the second exposure of the double exposure process. For this and other reasons, there is a need for the present invention.

SUMMARY OF THE INVENTION

The invention relates to utilizing contact printing as the second exposure within a double exposure attenuated phase shift mask (APSM) fabrication process. The process defines the shift pattern within the attenuated layer of the APSM using a first exposure, such as electron beam (e-beam) writing. The attenuated layer may be MoSi, MoSiO, or other suitable low transmission materials. The process then defines the border pattern within the opaque layer of the APSM using a second exposure. The second exposure employs contact printing, utilizing a contact exposure mask. The contact printing process may align the contact exposure mask over the wafer on which the APSM is fabricated utilizing a camera and an image storage system storing an image of this wafer.

Embodiments of the invention provide for advantages over the prior art. Using contact printing as the second exposure of the double exposure APSM fabrication process, in lieu of using conventional laser beam writing, provides for decreased processing times. This renders the APSM fabrication process less costly, and thus more advantageous. Contacting printing involves pressing the contact exposure border mask against the resist coated APSM during exposure. Furthermore, where alignment during the contact printing process utilizes a camera and an image storage system, depth of focus can be safely increased to 300 micron, with alignment accuracy better than +/− one micron. Still other aspects, embodiments, and advantages of the invention will become apparent by reading the detailed description that follows, and by referencing the accompanying drawings.

BRIEF DESCRIPTION OF THE DRAWINGS

The drawings referenced herein form a part of the specification. Features shown in the drawing are meant as illustrative of only some embodiments of the invention, and not of all embodiments of the invention, unless otherwise explicitly indicated, and implications to the contrary are otherwise not to be made.

DETAILED DESCRIPTION OF THE INVENTION

In the following detailed description of exemplary embodiments of the invention, reference is made to the accompanying drawings that form a part hereof, and in which is shown by way of illustration specific exemplary embodiments in which the invention may be practiced. These embodiments are described in sufficient detail to enable those skilled in the art to practice the invention. Other embodiments may be utilized, and logical, mechanical, and other changes may be made without departing from the spirit or scope of the present invention. The following detailed description is, therefore, not to be taken in a limiting sense, and the scope of the present invention is defined only by the appended claims.

Figure 2A:
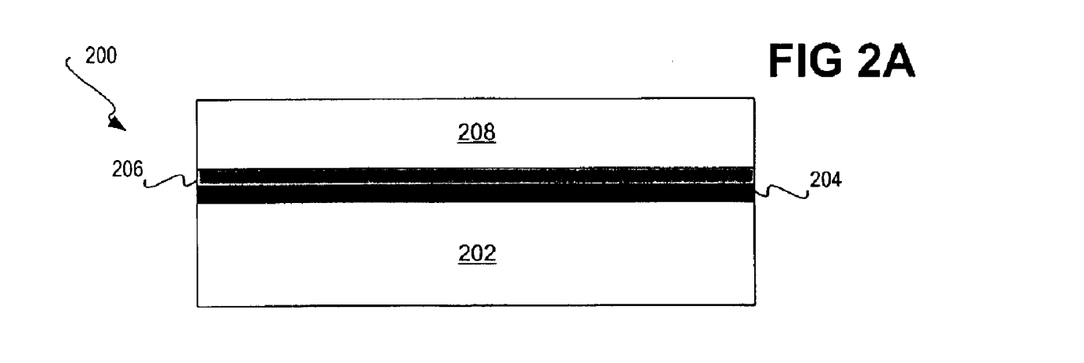
FIGS. 2A–2K are diagrams illustrating a double exposure APSM fabrication process utilizing contact printing for the second exposure, according to an embodiment of the invention.
Figure 2B:
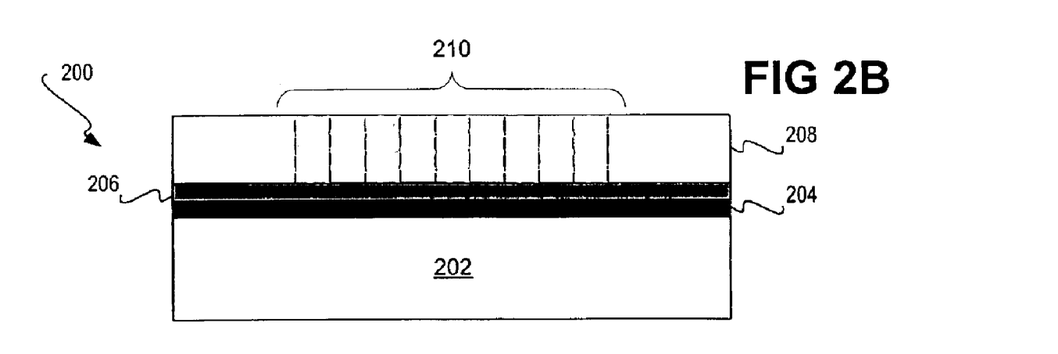

FIGS. 2A–2K illustrate a double exposure attenuated phase shift mask (APSM) fabrication process, according to an embodiment of the invention. In FIG. 2A, the APSM 200 includes a transparent substrate 202, such as quartz. Over the transparent substrate 202 is an attenuated layer 204, such as MoSi, MoSiO, or another low transmission material. Over the attenuated layer 204 is an opaque layer 206, such as chrome. Photoresist 208 is deposited, such as by coating, and so on, over the opaque layer 206. In FIG. 2B, the first exposure takes place, by electron beam (e-beam) writing desired areas 210 within the photoresist 208.

Figure 2C:
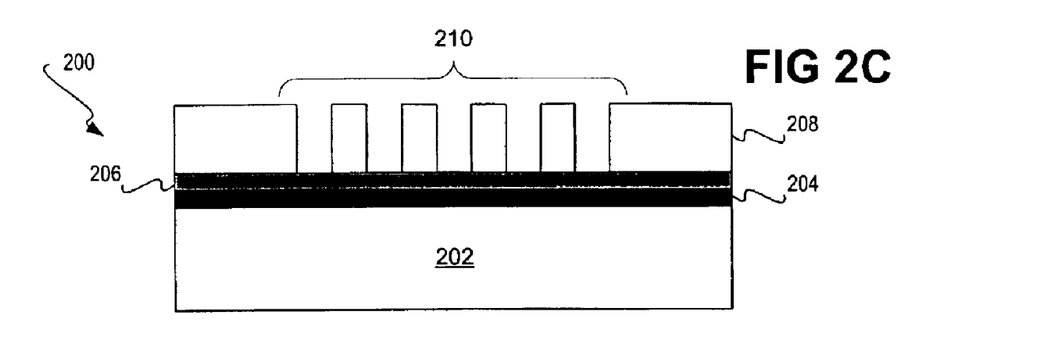
Figure 2D:
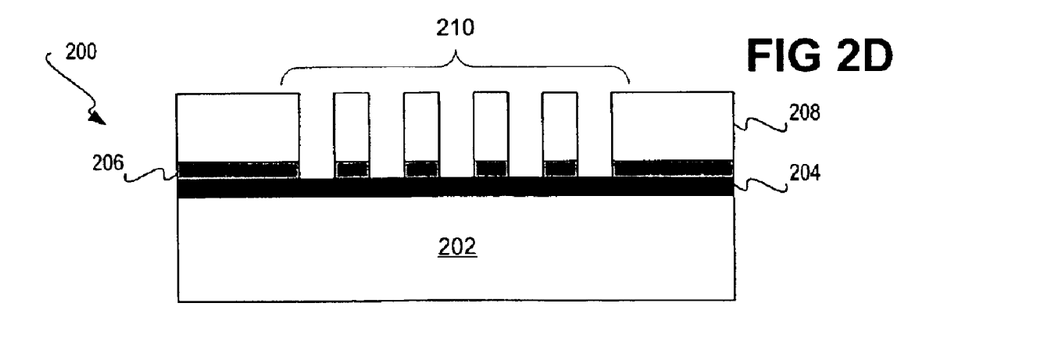
Figure 2E:
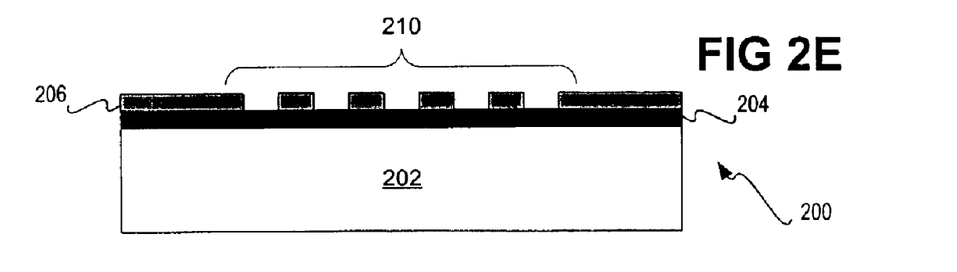
Figure 2F:
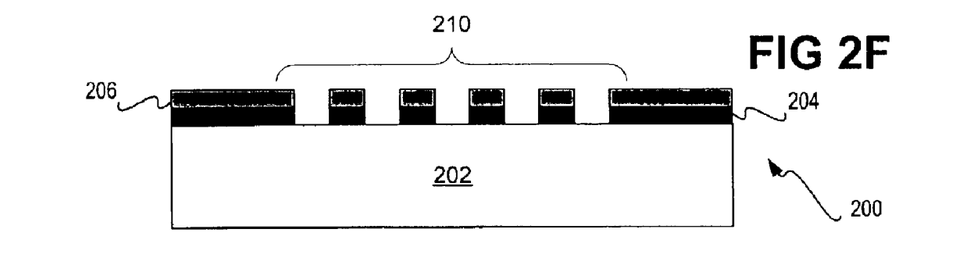

In FIG. 2C, the exposed areas 210 are developed, removing the photoresist 208 from the areas 210. In FIG. 2D, the opaque layer 206 is etched through the exposed areas 210, and in FIG. 2E, the photoresist 208 is removed, such as by photoresist stripping and subsequent cleaning of the APSM 200. Finally, in FIG. 2F, the attenuated layer 204 is etched through the exposed areas 210. Thus, the first exposure of the APSM fabrication process of this embodiment of the invention is for defining the shift pattern of the APSM 200, within the attenuated layer 204.

Figure 2G:
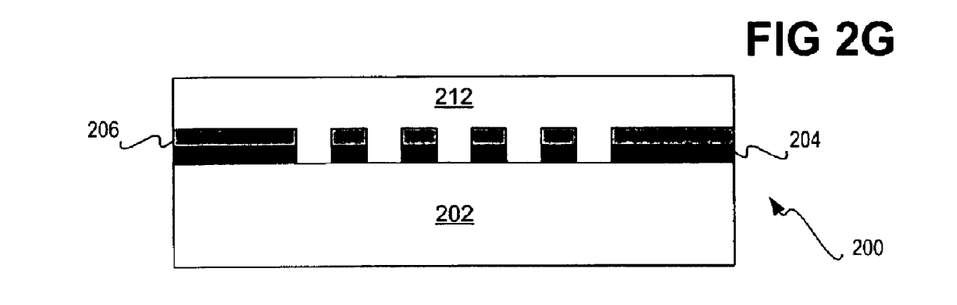
Figure 2H:
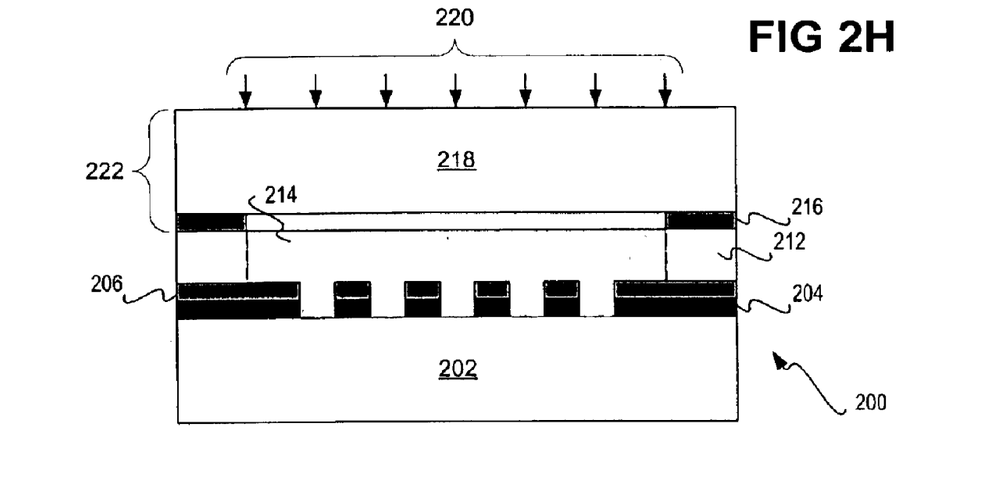

Next, in FIG. 2G, another layer of photoresist 212 is coated onto the APSM 200, and may be subsequently baked. In FIG. 2H, the second exposure takes place. The second exposure process writes a desired area 214 within the photoresist 212. The second exposure process is a contact exposure process. The contact exposure process utilizes a contact exposure mask 222, including an opaque layer 216 patterned in correspondence with the desired area 214, and a transparent layer 218 over the opaque layer 216. The opaque layer 216 may be chrome, whereas the transparent layer 218 may be quartz. The process is a contact process in that the mask 222 is pressed against and makes contact with the APSM 200, specifically the photoresist 212 thereof. The area 214 is defined by exposure to beams 220, which may be light beams, such as ultraviolet (UV) light beams.

Figure 2I:
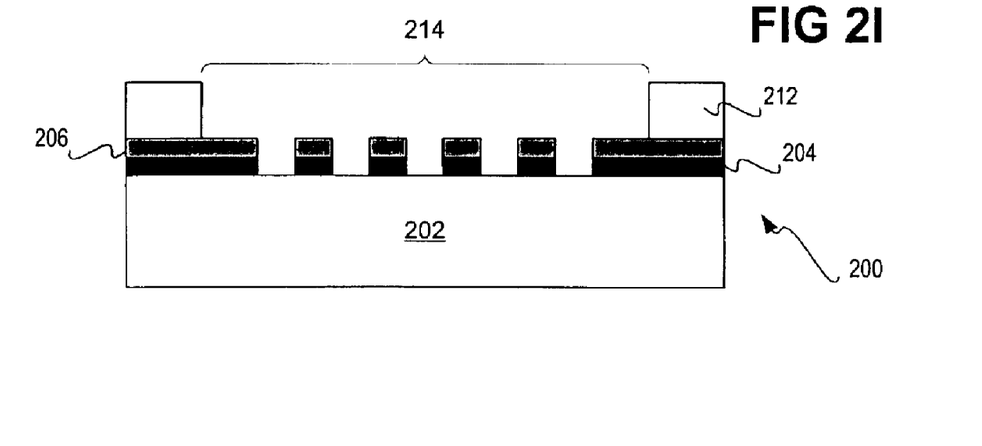
Figure 2J:
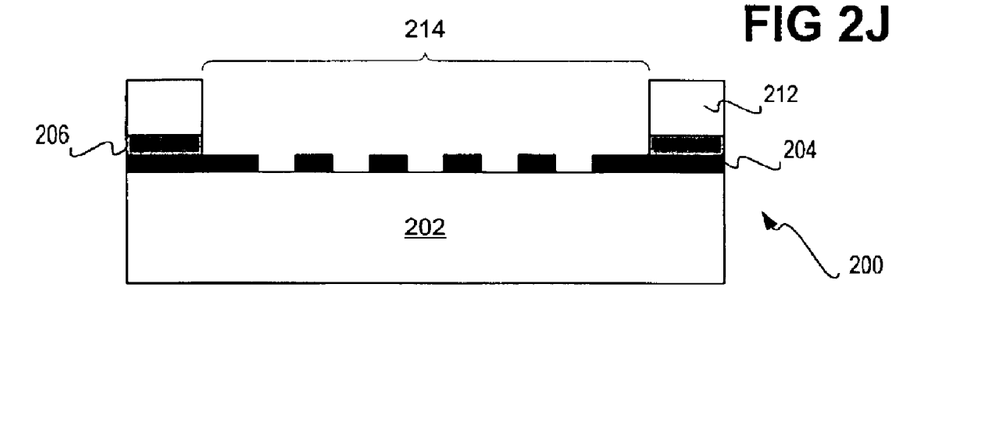
Figure 2K:
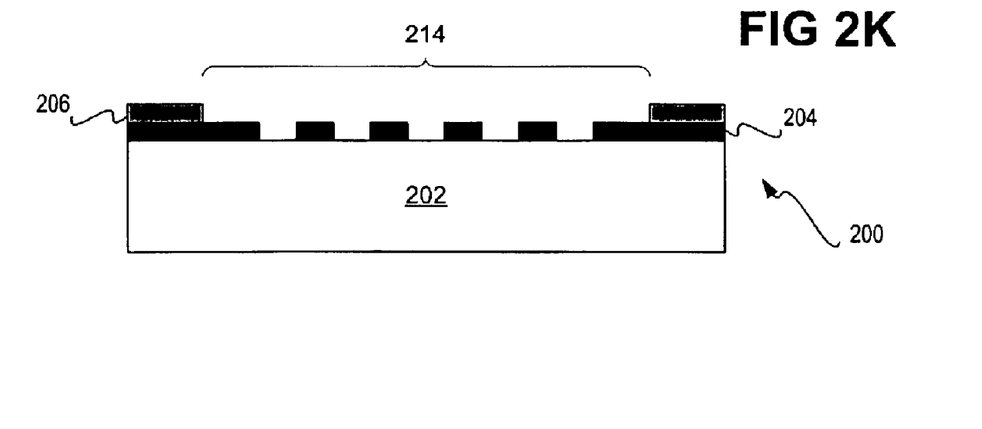

The second exposure process is needed to define a border pattern for the APSM 200. Thus, the mask 222 is a contact border mask. The contact exposure process may also be referred to as contact printing. In FIG. 2I, the exposed area 214 within the photoresist 212 is developed, removing the photoresist 212 from the area 214. In FIG. 2J, the opaque layer 206 is etched through the exposed area 214. Finally, in FIG. 2K, the photoresist 212 is removed, such as by photoresist stripping and subsequent cleaning of the APSM 200. Thus, the second exposure of the inventive double exposure APSM fabrication process is for defining the border pattern of the APSM 200 within the opaque layer 206, where the opaque layer 206 may be chrome. Using a contact exposure or a contact printing process is less time-consuming and thus more advantageous than the laser beam writing process of the prior art.

Figure 3A:
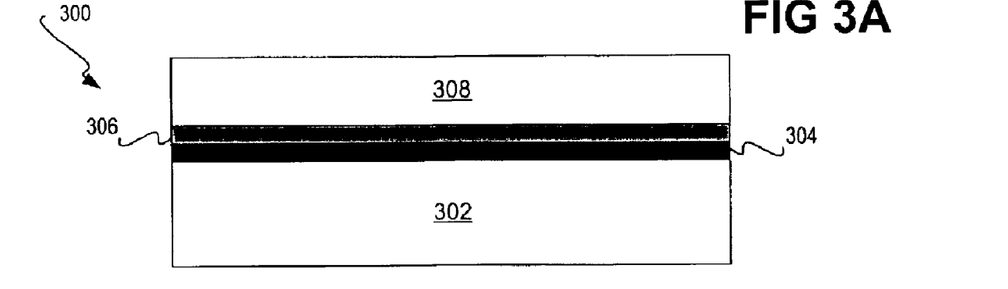
FIGS. 3A–3K are diagrams illustrating a double exposure APSM fabrication process utilizing contact printing for the second exposure, and where the resulting APSM includes one or more tri-tone seal ring patterns, according to an embodiment of the invention.
Figure 3B:
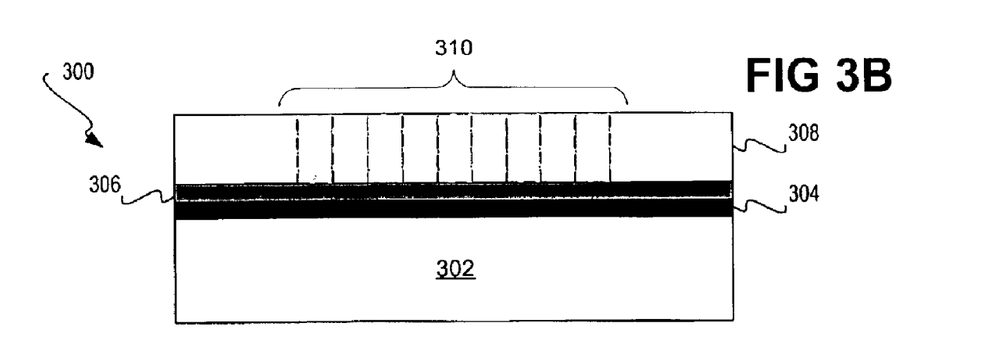
Figure 3C:
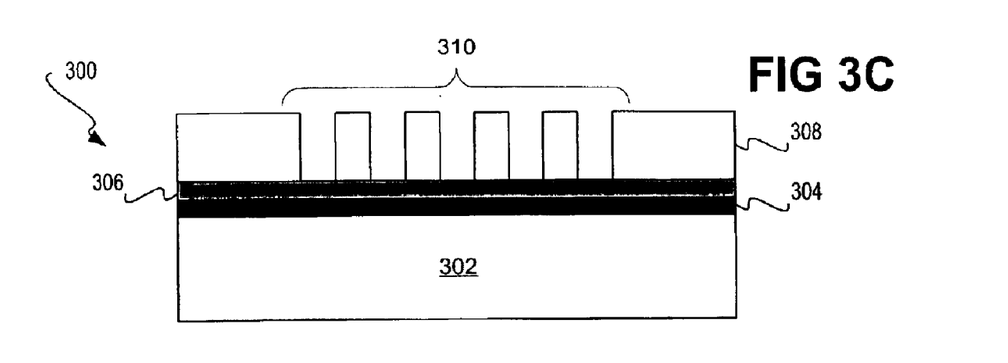

One or more tri-tone seal ring patterns may be defined using the first and the second exposure of the inventive APSM fabrication process, according to another embodiment of the invention. FIGS. 3A–3K illustrate such a double exposure APSM fabrication process, according to this embodiment of the invention. In FIG. 3A, the APSM 300 includes a transparent substrate 302. Over the transparent substrate 302 is an attenuated layer 304. Over the attenuated layer 304 is an opaque layer 306. Photoresist 308 is deposited over the opaque layer 306. In FIG. 3B, the first exposure takes place, by e-beam writing desired areas 310 within the photoresist 308. In FIG. 3C, the exposed areas 310 are developed, removing the photoresist 308 from the areas 310.

Figure 3D:
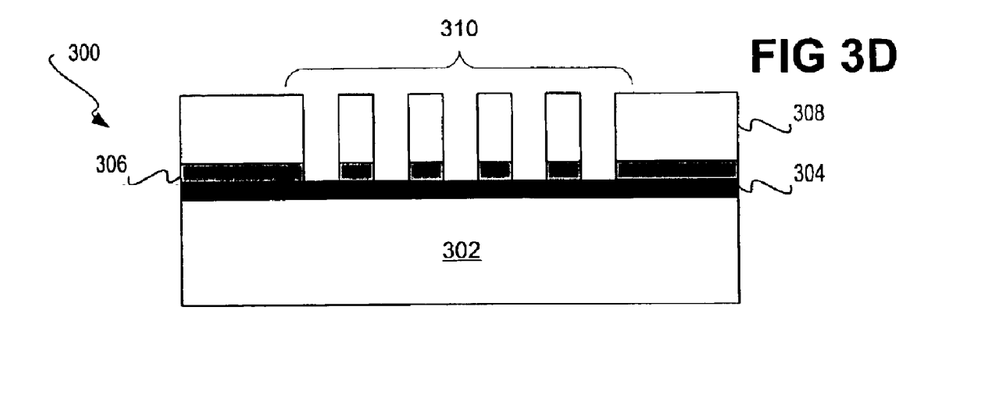
Figure 3E:
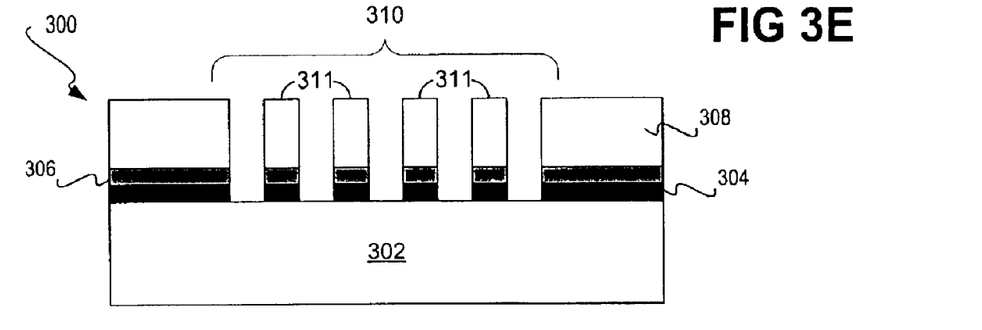
Figure 3F:
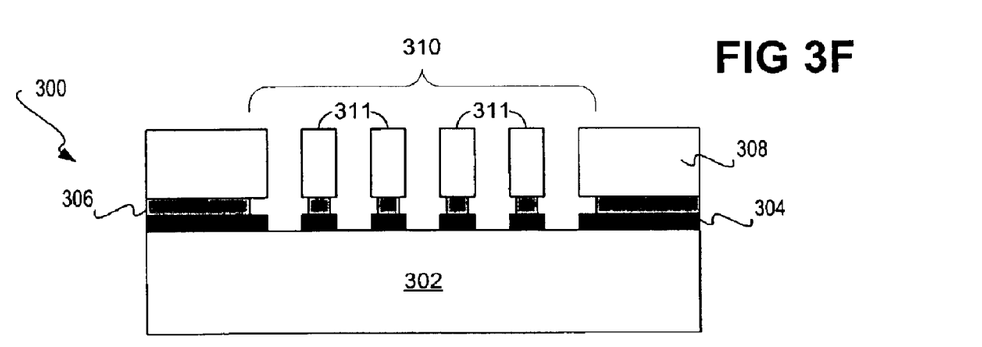
Figure 3G:
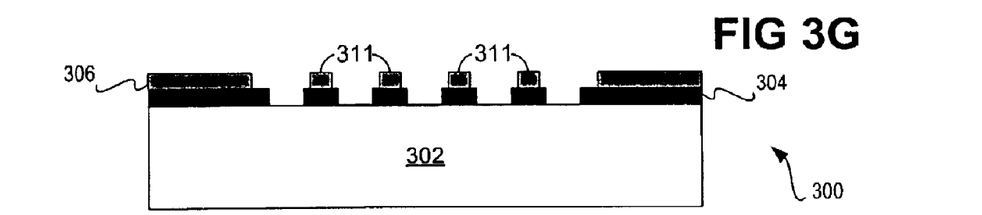

In FIG. 3D, the opaque layer 306 is etched through the exposed areas 310, and in FIG. 3E, the attenuated layer 304 is etched through the exposed areas 310. In FIG. 3F, further etching of the opaque layer 306 is accomplished as shown, and can be performed by wet etching. Finally, in FIG. 3G, the photoresist 308 is removed, such as by photoresist stripping and subsequent cleaning of the APSM 300. Thus, the first exposure of the APSM fabrication process of this embodiment of the invention is for defining the shift pattern of the APSM 300, within the attenuated layer 304. Furthermore, tri-tone areas 311 have also been defined by using the first exposure of the APSM fabrication process, and will be further defined by using the second exposure of this process, as will be described.

Figure 3H:
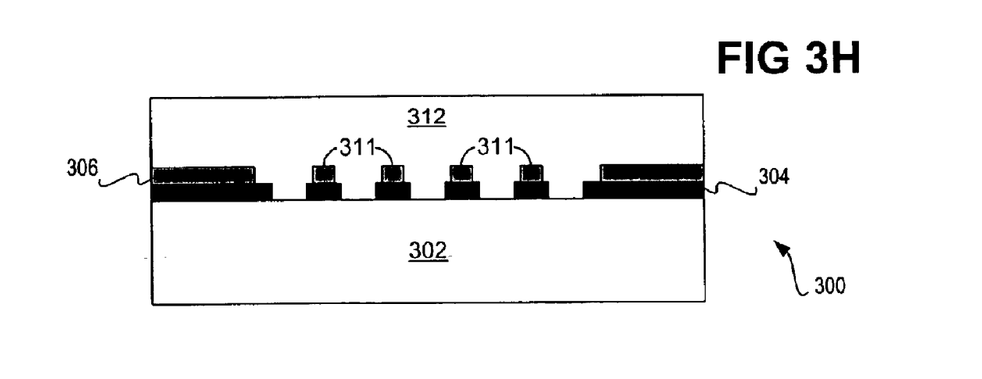
Figure 3I:
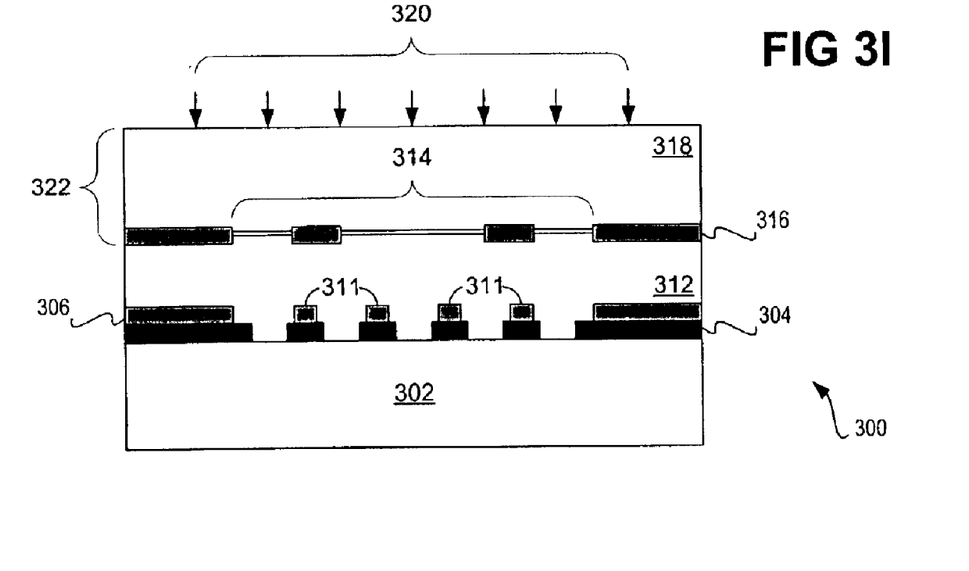

Next, in FIG. 3H, another layer of photoresist 312 is coated onto the APSM 300, or otherwise deposited. In FIG. 3I, the second exposure takes place. The second exposure process writes a desired pattern 314 within the photoresist 312. The second exposure process is a contact exposure process. The process utilizes a contact exposure mask 322, including an opaque layer 316 patterned in correspondence with the desired pattern 314, and a transparent layer 318 over the opaque layer 316. The mask 322 is pressed against and makes contact with the APSM 300, specifically the photoresist 312 thereof. The area 314 is defined by exposure to beams 320, which may be light beams, such as UV light beams.

Figure 3J:
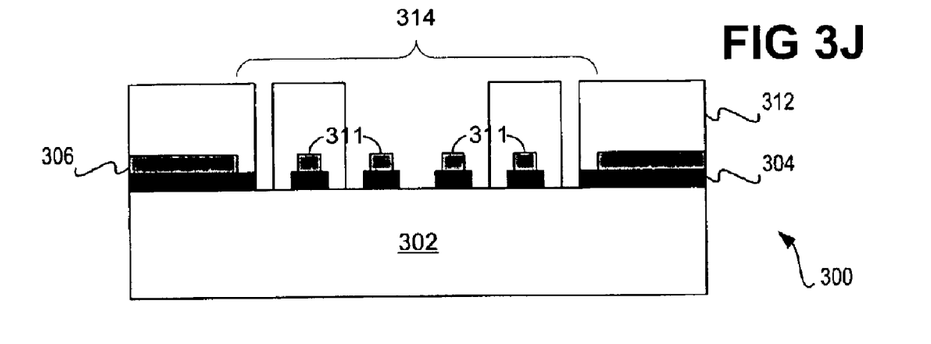
Figure 3K:
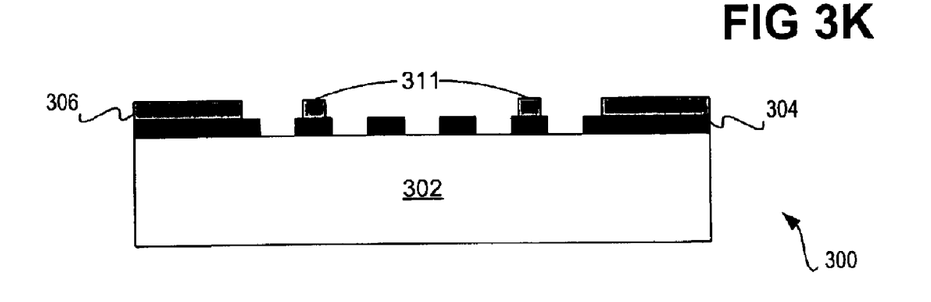

The second exposure process is needed to define a border pattern for the APSM 300. Thus, the mask 322 is a contact border mask. Furthermore, the second exposure mask further defines the tri-tone areas 311. In FIG. 3J, the exposed pattern 314 within the photoresist 312 is developed, removing the photoresist 312 in accordance with the pattern 314. The part of the opaque layer 306 that is exposed through the photoresist is then removed, such as by etching, and the remaining photoresist 312 is removed, such as by stripping. The end result is shown in FIG. 3K. Thus, the second exposure of the inventive double exposure APSM fabrication process defines the border pattern of the APSM 300 within the opaque layer 306.

Furthermore, the second exposure selectively etches some of the tri-tone areas 311, leaving those of the tri-tone areas 311 shown in FIG. 3K. That is, both the first exposure and the second exposure are used to define the tri-tone areas 311. The first exposure is used to form the tri-tone areas 311, whereas the second exposure is used to selective which of the tri-tone areas 311 should remain. The tri-tone areas are tri-tone in that they include part of the transparent substrate 302, part of the opaque layer 304, and part of the attenuated layer 306. The tri-tone areas may also be referred to as tri-tone seal rings, as can be appreciated by those of ordinary skill within the art.

Figure 4A:
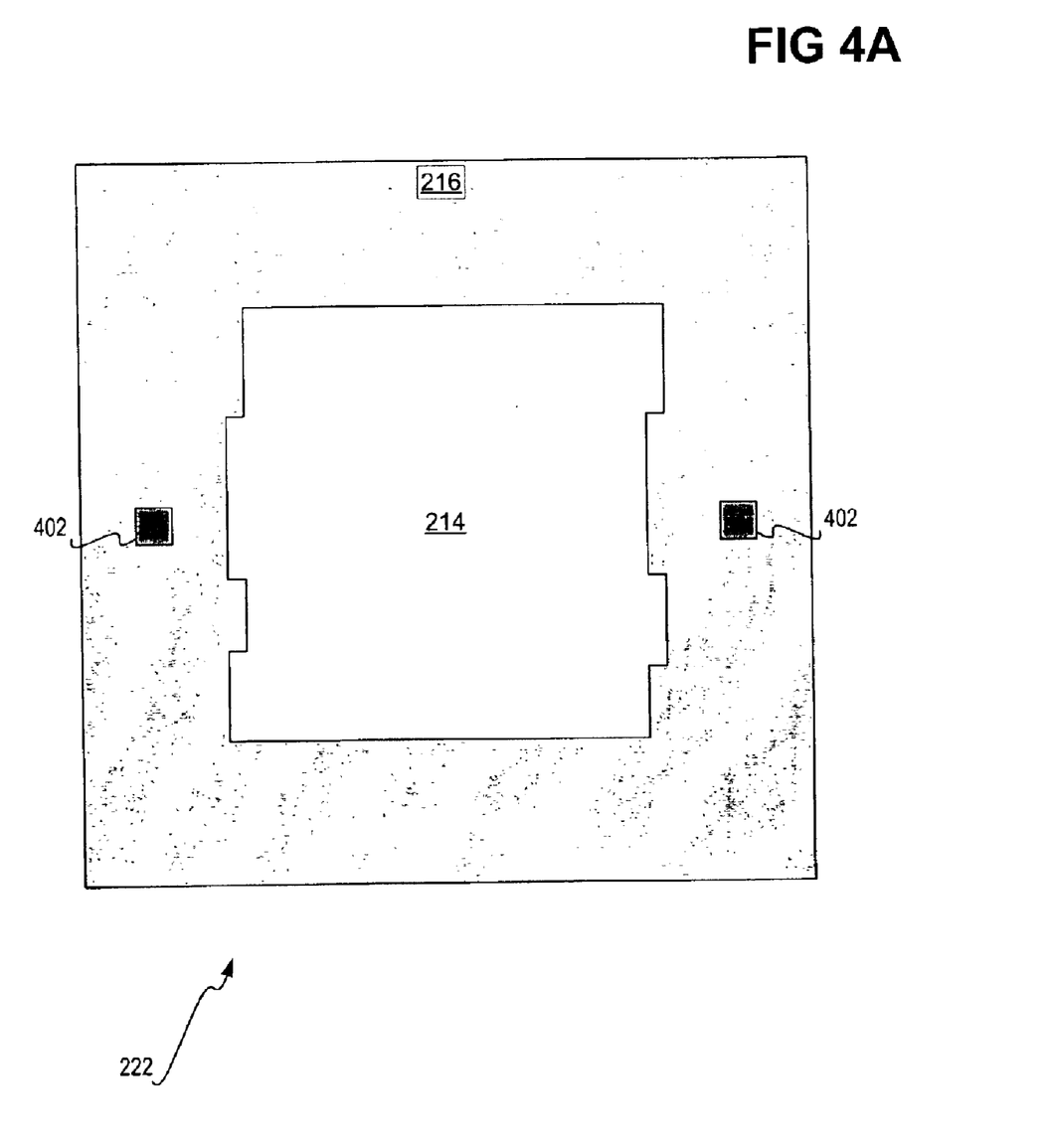
FIGS. 4A–4B are diagrams of border masks that may be used during the contact printing of the second exposure of the inventive double exposure APSM fabrication process, according to varying embodiments of the invention.
Figure 4B:
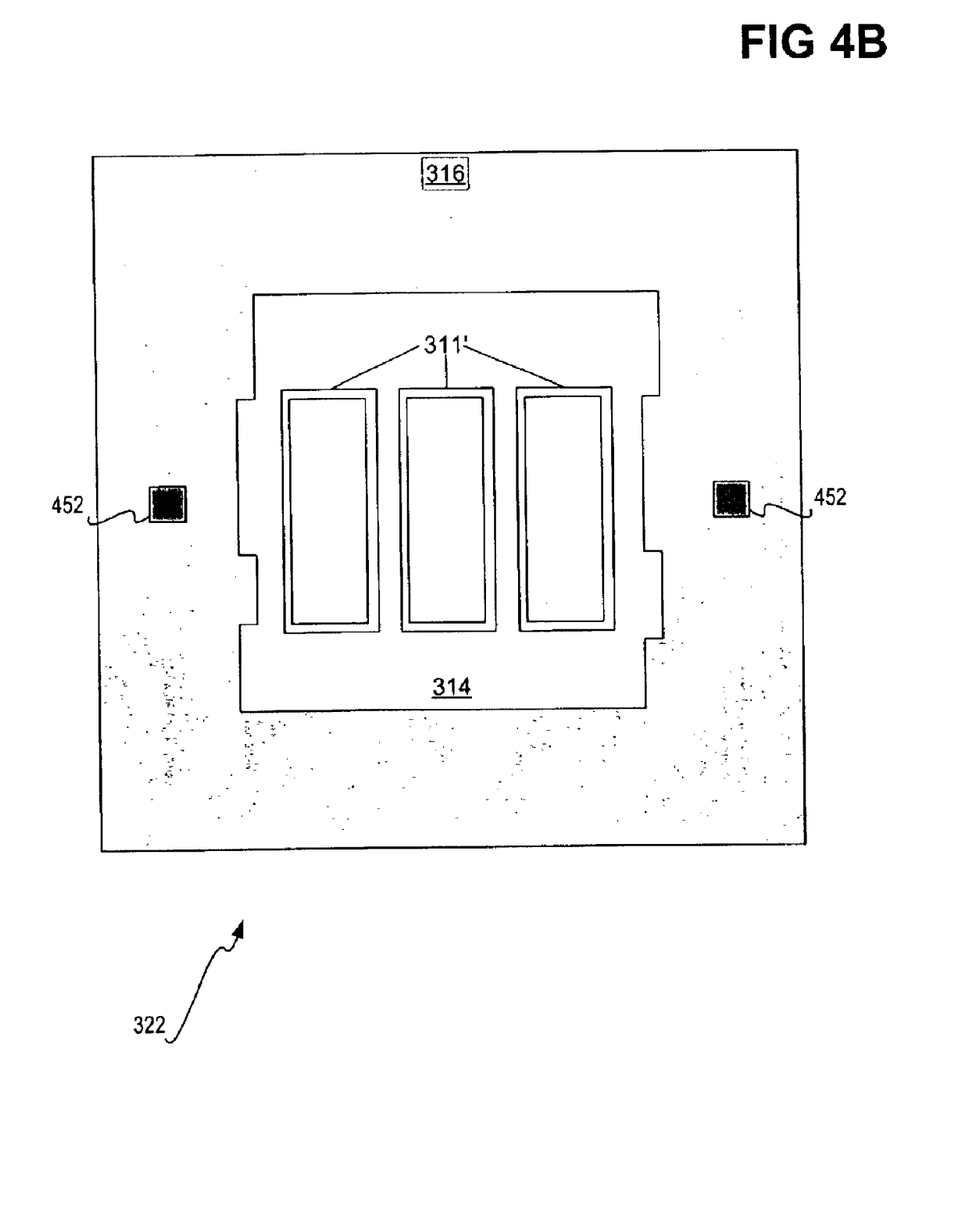

FIGS. 4A and 4B show top views of the border mask 222 of FIG. 2H and of the border mask 322 of FIG. 3I, respectively, according to an embodiment of the invention. In FIG. 4A, the border mask 222 includes the opaque layer 216 having defined therein the desired area 214. Contact printer alignment marks 402 are present within the border mask 222, as will be described in more detail. Similarly, in FIG. 4B, the border mask 322 includes the opaque layer 316 having defined therein the desired pattern 314. The desired pattern 314 includes tri-tone area patterns 311' corresponding to the tri-tone areas 311 of FIG. 3I and other figures. Contact printer alignment marks 452 are present within the border mask 322, as will be described in more detail.

Figure 5:
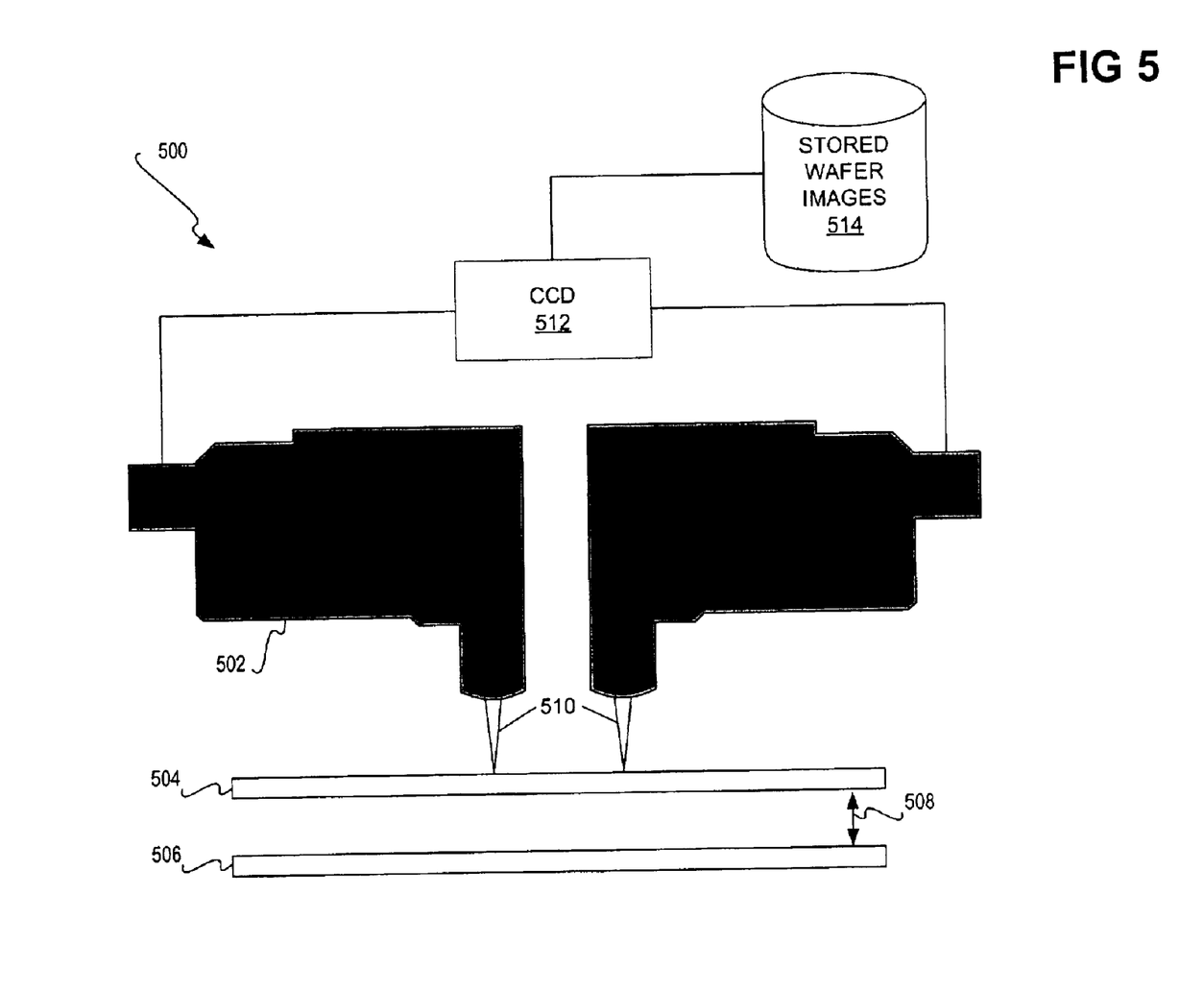
FIG. 5 is a diagram of an alignment and exposure system for use in an embodiment of the inventive double exposure APSM fabrication process during the contact printing of the second exposure, according to one embodiment of the invention.

FIG. 5 shows an alignment and exposure system 500 according to an embodiment of the invention. The system 500 provides for better depth-of-field, alignment gap, and alignment accuracy, as compared to alignment and exposure systems of the prior art. The system 500 includes an alignment and exposure tool 502 communicatively coupled to a camera 512, and which itself is communicatively coupled to an image storage system 514. The alignment and exposure tool 502 emits beams 510, such as light beams like UV beams. The wafer 506 on which the APSM is being fabricated is exposed to the beams 510 through the border contact mask 510. There can be a gap 508 between the mask 510 and the wafer 506.

To align the mask 510 over the wafer 506, an image of the wafer as stored in the system 514 is utilized, as opposed to utilization of the actual wafer 506 itself. The image storage system 514 is able to obtain images of the wafer 506 through the clear field in the mask 504, via the camera 512, which may be a charge-coupled device (CCD), or another type of camera. Thus, the alignment marks on the mask 504 are aligned with the alignment marks on the wafer 506 as the wafer 506 is stored in the system 514, as opposed to the actual wafer 506. This allows for an alignment gap 508 of up to 300 microns in one embodiment, with alignment accuracy better than +/−one micron. Thus, depth of field is improved.

For actual contact exposure, once alignment has been accomplished, the mask 510 is placed in contact with the wafer 506. Contact is preferably accomplished by a hard contact mode or a vacuum contact mode, as known by those of ordinary skill within the art, as opposed to by a soft contact mode, as is also known by those of ordinary skill within the art. The hard contact mode utilizes nitrogen pressure in addition to mechanical pressure to have the mask and the wafer 506 make contact with each other. The vacuum contact mode utilizes a vacuum in addition to mechanical pressure for making contact. By comparison, the soft contact mode uses only adjustable mechanical pressure.

Figure 6:
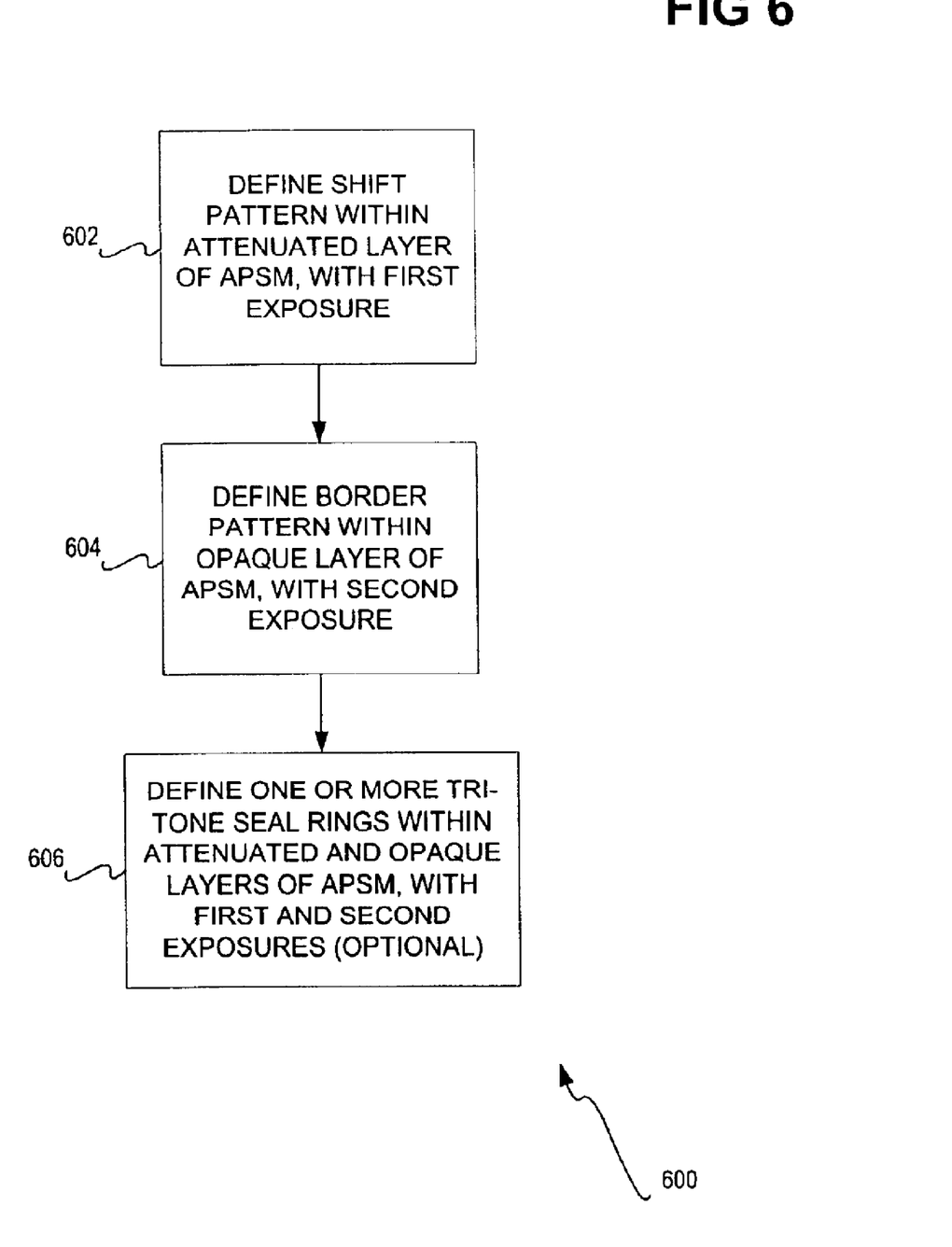
FIG. 6 is a flowchart of a method according to an embodiment of the invention.

FIG. 6 shows a method 600 that summarizes the double exposure APSM fabrication process that has been described, according to an embodiment of the invention. First, a shift pattern is defined within the attenuated layer of the APSM, utilizing a first exposure, such as e-beam writing (602). Next, a border pattern is defined within the opaque layer of the APSM, utilizing a second exposure, such as contact printing (604). Optional in the method 600 is the definition of one or more tri-tone seal rings (606). Such seal rings are defined within the attenuated and opaque layers, in conjunction with the transparent layer, of the APSM. As has been described, such definition is performed during both the first and the second exposures.

It is noted that, although specific embodiments have been illustrated and described herein, it will be appreciated by those of ordinary skill in the art that any arrangement is calculated to achieve the same purpose may be substituted for the specific embodiments shown. This application is intended to cover any adaptations or variations of the present invention. Therefore, it is manifestly intended that this invention be limited only by the claims and equivalents thereof.

What is claimed is:

1. A double exposure attenuated phase shift mask (APSM) fabrication method comprising:
 defining a shift pattern within an attenuated layer of the APSM using a first exposure other than contact exposure; and,
 defining a border pattern within an opaque layer of the APSM using a second exposure that is a contact exposure utilizing a contact exposure mask.

2. The method of claim 1, wherein defining the shift pattern within the attenuated layer of the APSM comprises utilizing electron beam (e-beam) writing as the first exposure.

3. The method of claim 1, wherein defining the border pattern within the opaque layer of the APSM comprises utilizing contact printing with the contact exposure mask as the second exposure.

4. The method of claim 1, wherein using the second exposure that is the contact exposure comprises aligning the contact exposure mask over a wafer on which the APSM is fabricated utilizing a camera and an image storage system storing an image of the wafer on which the APSM is fabricated.

5. The method of claim 4, wherein utilizing the camera comprises utilizing a charge-coupled device (CCD).

6. The method of claim 1, further comprising defining one or more tri-tone seal ring patterns within the attenuated layer and the opaque layer of the APSM.

7. The method of claim 6, wherein defining the one or more tri-tone seal ring patterns comprises using the first exposure that is also used to define the shift pattern within the attenuated layer and the second exposure that is also used to define the border pattern within the opaque layer.

8. An attenuated phase shift mask (APSM) fabricated on a wafer at least in part by performing a double exposure APSM fabrication method comprising:
 defining a shift pattern within an attenuated layer of the APSM using electron beam (writing) as a first exposure; and,
 defining a border pattern within an opaque layer of the APSM using contact printing with a contact border mask as a second exposure.

9. The APSM of claim 8, wherein using the contact printing comprises aligning the contact border mask over the wafer utilizing a camera and an image storage system storing an image of the wafer.

10. The APSM of claim 9, wherein utilizing the camera comprises utilizing a charge-coupled device (CCD).

11. The APSM of claim 8, wherein the method further comprises defining one or more tri-tone seal ring patterns within the attenuated and the opaque layers of the APSM.

12. The APSM of claim 11, wherein defining the one or more tri-tone seal ring patterns comprises using the first exposure that is also used to define the shift pattern within the attenuated layer and the second exposure that is also used to define the border pattern within the opaque layer.

13. An attenuated phase shift mask (APSM) comprising:
 a transparent substrate;
 an attenuated layer over the transparent substrate having a shift mask defined therein via a first exposure other than contact exposure; and,
 an opaque layer over the attenuated layer having a border mask defined therein via a second exposure that is a contact exposure utilizing a contact exposure mask.

14. The APSM of claim 13, wherein the transparent substrate comprises quartz.

15. The APSM of claim 13, wherein the attenuated layer comprises one of MoSi and MoSiO.

16. The APSM of claim 13, wherein the opaque layer comprises chrome.

17. The APSM of claim 13, wherein one or more tri-tone seal ring patterns are within the attenuated layer and the opaque layer.

18. The APSM of claim 13, wherein the first exposure comprises electron beam (e-beam) writing.

19. The APSM of claim 13, wherein the second exposure comprises contact printing with the contact exposure mask.

20. The APSM of claim 13, wherein the second exposure aligns the contact exposure mask over the wafer utilizing a camera and an image storage system storing an image of the wafer.

* * * * *